(12) United States Patent
Enoksson et al.

(10) Patent No.: US 7,567,375 B2
(45) Date of Patent: Jul. 28, 2009

(54) HIDDEN HINGE MEMS DEVICE

(75) Inventors: Peter Enoksson, Mölndal (SE); Martin Bring, Göteborg (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 12/078,637

(22) Filed: Apr. 2, 2008

(65) Prior Publication Data
US 2008/0186557 A1   Aug. 7, 2008

Related U.S. Application Data

(63) Continuation of application No. 11/174,568, filed on Jul. 6, 2005, now Pat. No. 7,372,617.

(51) Int. Cl.
*G02B 26/00* (2006.01)

(52) U.S. Cl. ....................... 359/291; 359/292

(58) Field of Classification Search ................ 359/290, 359/291, 292, 295, 220, 222, 223, 224, 320, 359/298
See application file for complete search history.

(56) References Cited

U.S. PATENT DOCUMENTS

| 4,566,935 A | 1/1986 | Hornbeck | 438/29 |
|---|---|---|---|
| 4,710,732 A | 12/1987 | Hornbeck | 359/291 |
| 4,956,619 A | 9/1990 | Hornbeck | 359/317 |
| 7,046,415 B2 | 5/2006 | Jilani et al. | 359/224 |
| 7,068,417 B2 | 6/2006 | Yang | 359/291 |
| 7,075,701 B2 | 7/2006 | Novotny et al. | 359/291 |
| 2006/0187525 A1 | 8/2006 | Yang | 359/291 |

OTHER PUBLICATIONS

Chinese Office Action issued Oct. 10, 2008 for corresponding Chinese Patent Application No. 2006101054273.

*Primary Examiner*—Hung X Dang
*Assistant Examiner*—Tuyen Q Tra
(74) *Attorney, Agent, or Firm*—Harness, Dickey & Pierce, P.L.C.

(57) ABSTRACT

The present invention relates to a method for manufacturing a MEMS device, including the actions of: providing a substrate having a back and front surface essentially in parallel with each other, defining in said substrate at least one hidden support by removing material from said substrate, connecting said at least one hidden support onto a wafer with at least one actuation electrode capable to actuate at least a part of said substrate, wherein a rotational axis of said reflective surface is essentially perpendicular to said hidden support. The invention also relates to the MEMS as such.

12 Claims, 9 Drawing Sheets

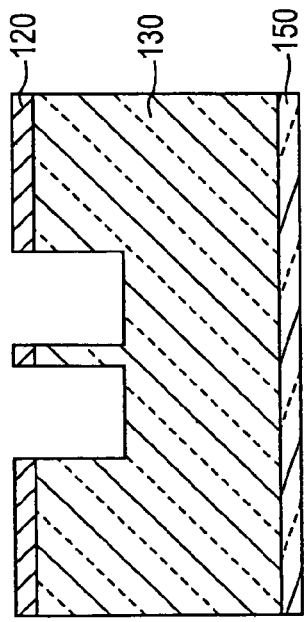
Fig. 1
Process Steps:
1. Photolithography
2. Oxide dry edge
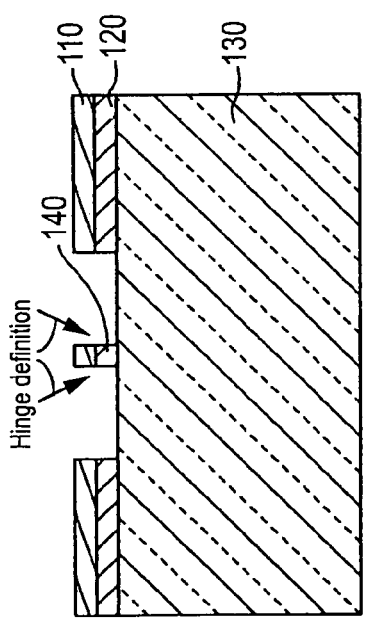
Fig. 2
Process Steps:
1. Remove resist in remover
2. Dry etch of hinges
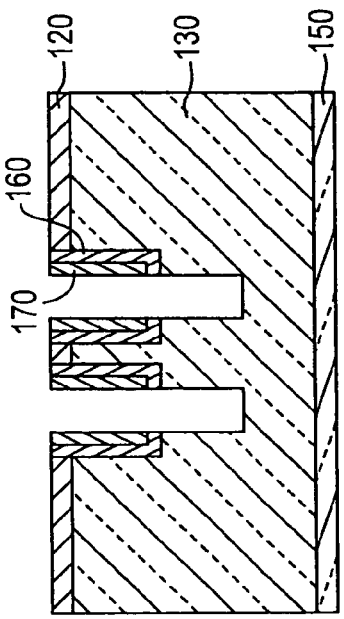
Fig. 3
Process Steps:
1. Dry oxide
2. Deposit nitride
3. Deposit oxide
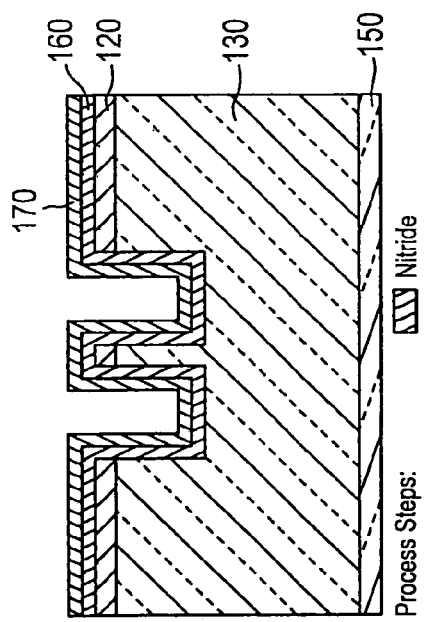
Fig. 4
Process Steps:
1. Dry etch oxide and nitride
2. Dry etch silicon
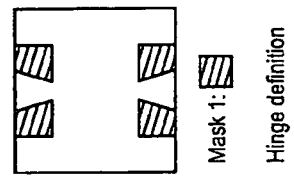
Mask 1:
Hinge definition

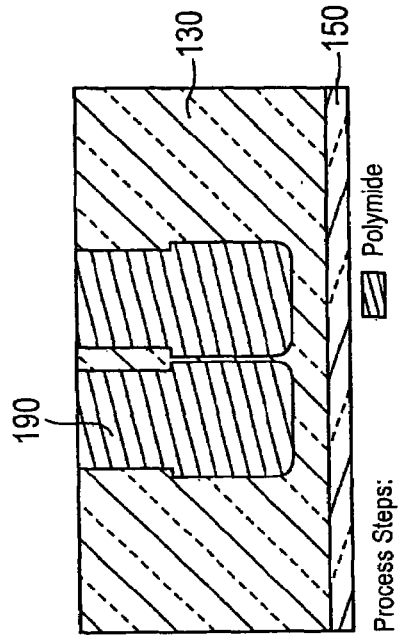
Fig. 5
Process Steps: 1. Thermal oxidation
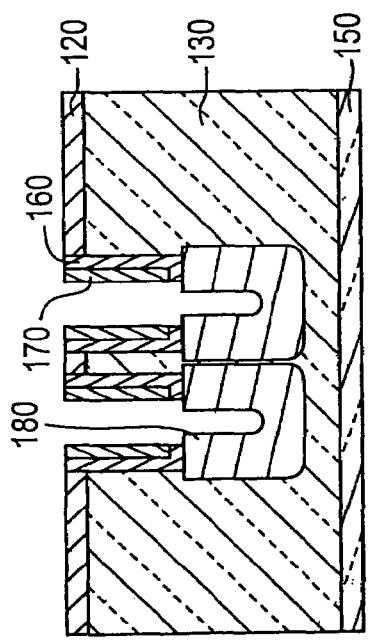
Fig. 6
Process Steps:
1. Strip SIO and SIN in SOE
2. Coat with polymide
3. Ash with O2 plasma to remove unwanted polymide
▨ Polymide
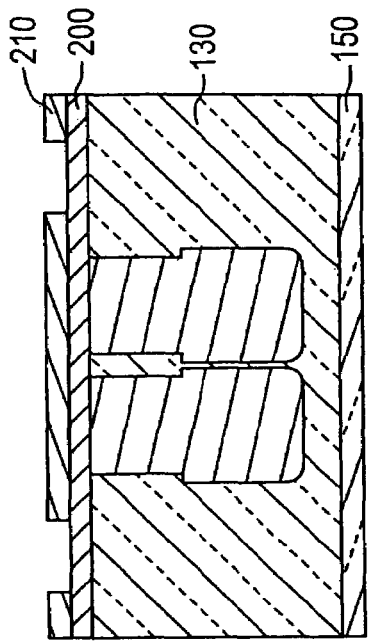
Fig. 7
Process Steps:
1. Deposit aluminum
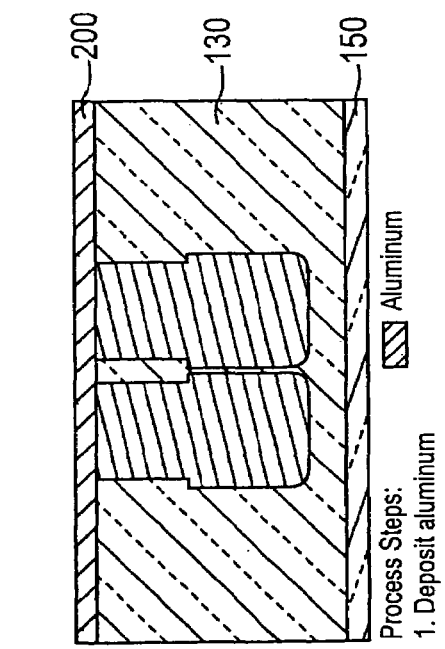
Fig. 8
Process Steps:
1. Photolithorgraphy
2. Dry etch of aluminum
▨ Aluminum
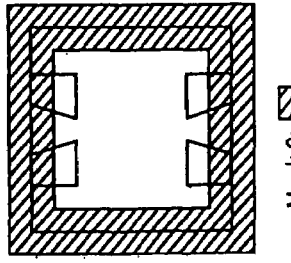
Mask 2: ▨ Area for mirror separation trenches

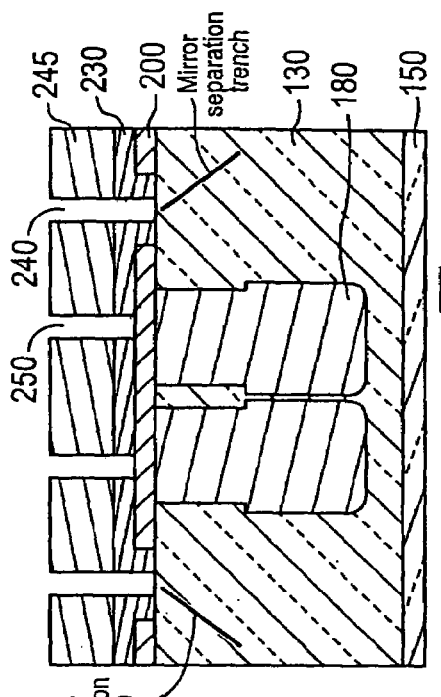
Fig. 10
Process Steps:
1. E-beam/photolithography
2. Dry etch of nitride
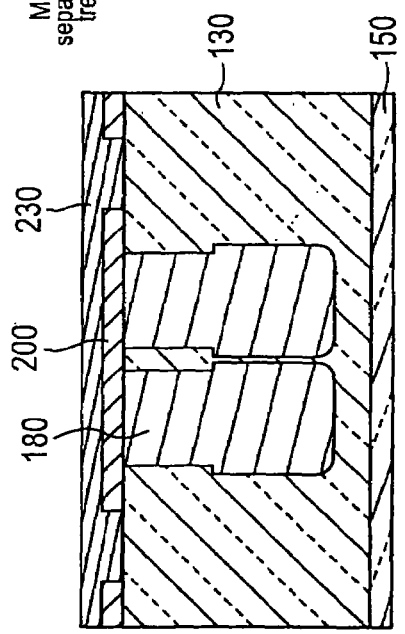
Fig. 9
Process Steps:
1. Strip resist
2. Deposit oxide
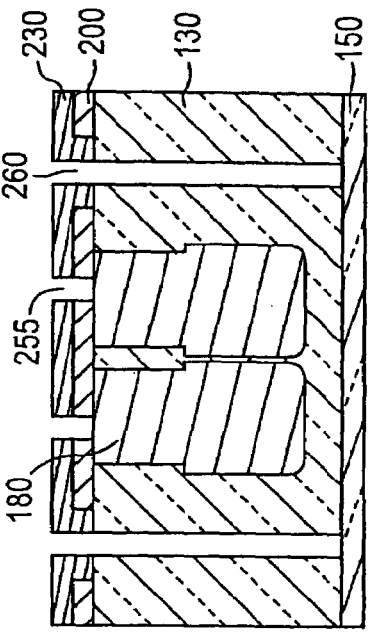
Fig. 12
Process Steps:
1. Dry etch of aluminum
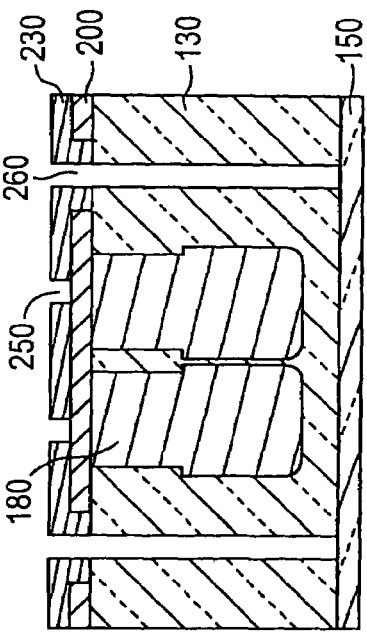
Fig. 11
Process Steps:
1. Remove resist in acetone
2. Dry etch of separation trenches
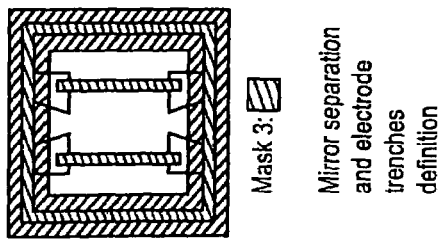
Mask 3: Mirror separation and electrode trenches definition

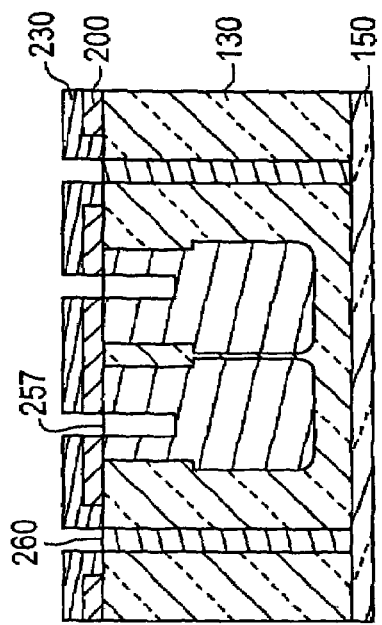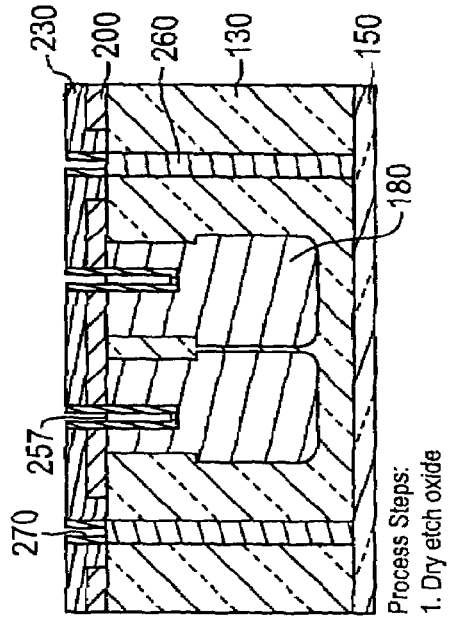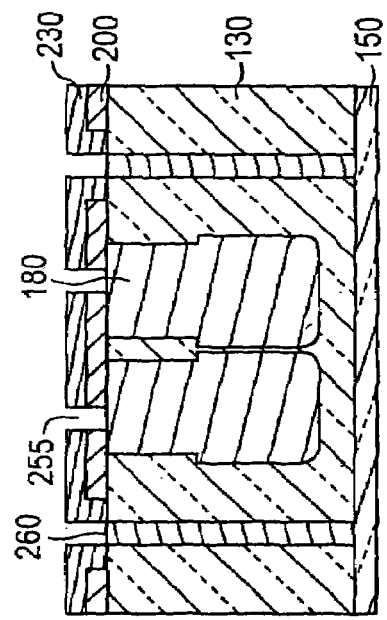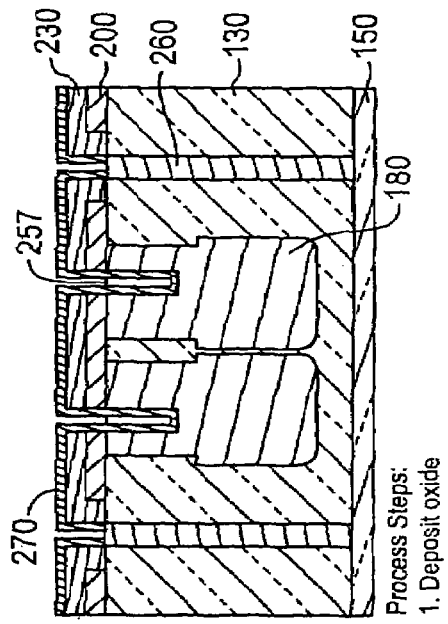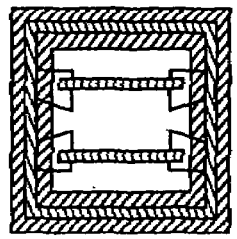

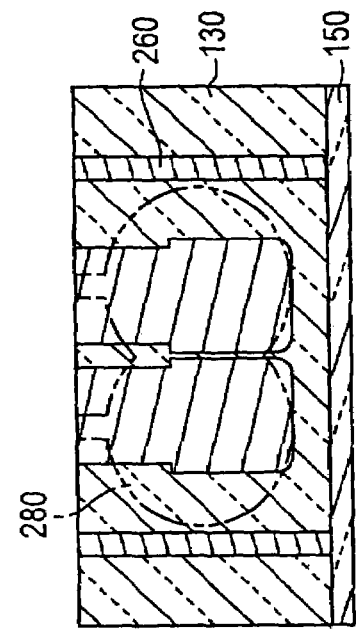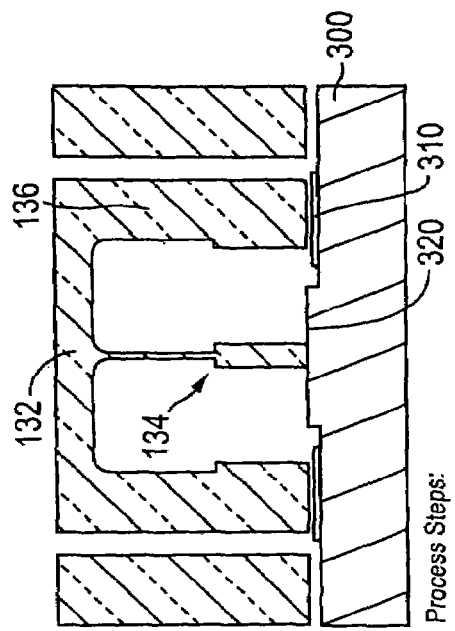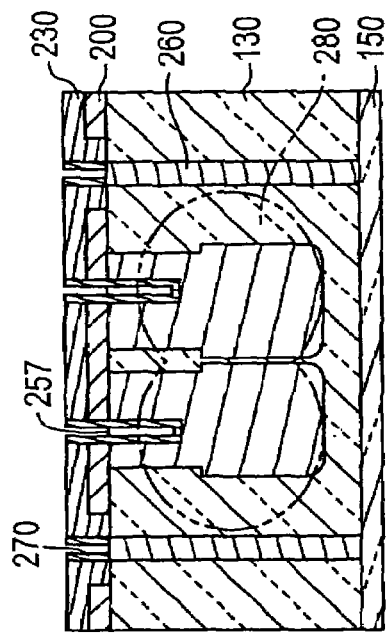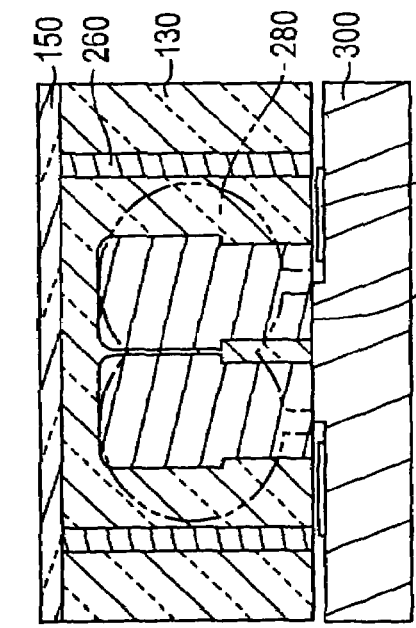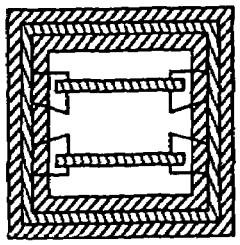

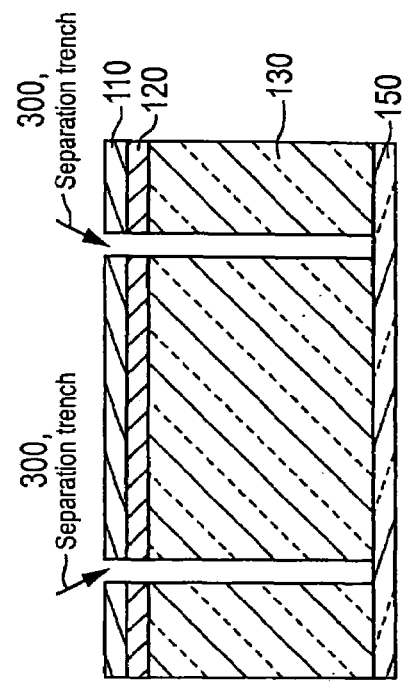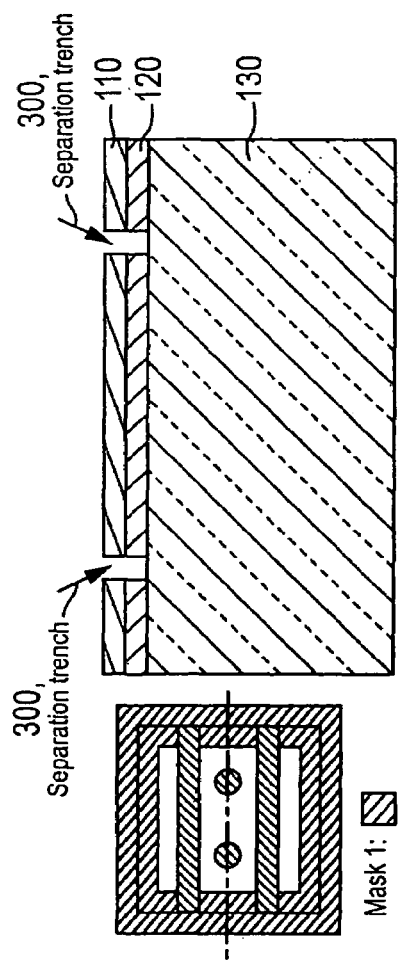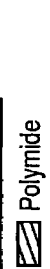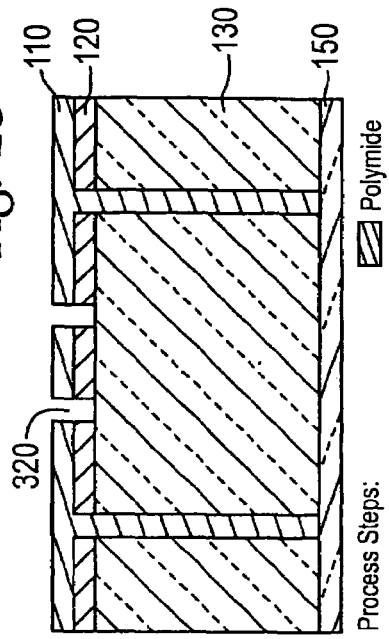

HIDDEN HINGE MEMS DEVICE

This application is a continuation of, and claims priority under 35 U.S.C. § 120 to, application Ser. No. 11/174,568 filed on Jul. 6, 2005 now U.S. Pat. No. 7,372,617. The entire contents of this application is incorporated herein by reference.

TECHNICAL FIELD

The present invention relates in general to techniques for forming an integrated device, e.g. a semiconductor device, and in particular to a method for manufacturing micro mirrors with a hidden hinge and to an SLM comprising such micro mirrors.

DESCRIPTION OF THE BACKGROUND ART

It is well known in the current art to build spatial light modulators (SLM) of a micro mirror type U.S. Pat. Nos. 4,566,935, 4,710,732, 4,956,619. In general two main principles for building integrated devices, such as micro mirror SLM, have been employed.

An integrated circuit (IC) is manufactured to a finished state, and then the micro mirrors are manufactured on said IC. The micro mirrors are built onto the IC wafers. An advantage with this approach is that so called IC foundries can be, used, which presents a very cost efficient manufacturing of the electronics wafers. A disadvantage is that there is a very restricted selection of materials and methods that are usable for the manufacturing of the micro mirrors, because there is an upper temperature limit of about 400° C., above which the electronics will be damaged. This makes the manufacturing of micro mirror having optimal performance more difficult.

Another way of building micro mirror SLM's is at the end of the process for making the IC, micro mirror manufacture may be started on the same wafers. An advantage with this approach may be that there is a greater freedom of selecting materials, methods and temperatures for the manufacture of micro mirrors having good performance. A disadvantage is that the IC wafers cannot be manufactured in standard IC foundries, because they have very strict demands on a process of manufacturing to be standardized in order to be able to maintain the quality in the process.

Yet another way of building micro mirror SLM's may be to manufacture the IC on a first wafer and a micromirror array on a second wafer. Said first and second wafers may be attached to each other by means of bonding. One problem with such a method may be the tight demands on the alignment between said first and second wafers, a misalignment may affect the functionality of one or several pixels.

Micromirrors in SLM may be made of aluminum due to its good optical performance. However, there may be some drawbacks by using mirrors made of Aluminum such as: the mirrors may not be perfectly flat, a mirror height may differ between mirrors, the mirrors may bend when tilted, the mirrors may sag when tilted, the mirrors may have a built in predeflection which may be different from mirror to mirror, the hinge may have anelastic behaviour.

Therefore, there is a need in the art for an improved method for manufacturing micro electrical/mechanical/optical integrated devices.

SUMMARY OF THE INVENTION

In view of the foregoing background, the method for manufacturing integrated devices, such as for example micro mirror SLM's, is critical for the performance of such devices.

Accordingly, it is an object of the present invention to provide an improved manufacturing method and/or design for an integrated device which overcomes or at least reduces the above mentioned problems.

In an example embodiment, the invention provides a method of for manufacturing a MEMS device, including providing a substrate having a back and a front surface essentially is parallel with each other, defining in said substrate at least one hidden support by removing material from said substrate, connecting said at least one hidden support onto a wafer with at least one actuation electrode capable to actuate at least a part of said substrate, wherein a rotational axis of said reflective surface is essentially perpendicular to said hidden support.

In another example embodiment, the invention provides a MEMS device comprising a substrate having at least one reflective surface, at least one hidden support formed out of the same material as said substrate, at least one actuation electrode provided on a wafer capable to actuate said reflective surface, wherein said wafer is connected to said substrate and a rotational axis of said reflective surface is essentially perpendicular to said hidden support.

BRIEF DESCRIPTION OF THE DRAWINGS

For a more complete understanding of the present invention, and the advantages thereof, reference is now made to the following description taken in conjunction with the accompanying drawings, in which:

FIG. 1-20 shows an example embodiment of process steps in consecutive order according to the present invention for manufacturing a micromirror with a hidden hinge.

FIG. 22-32 illustrates another example embodiment of an inventive manufacturing process for the inventive MEMS device.

DETAILED DESCRIPTION OF THE PREFERRED EMBODIMENTS

Figure 21:
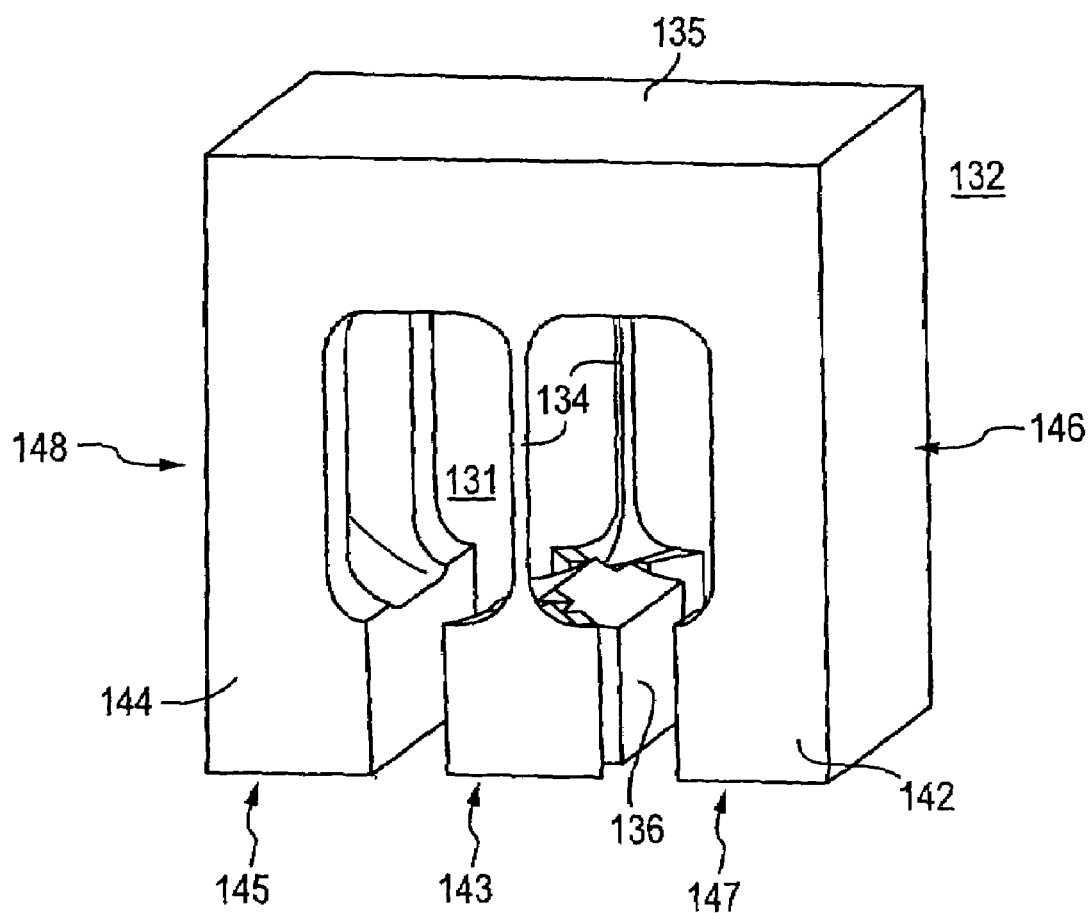
FIG. 21 illustrates a 3D view of an example embodiment of a micromirror according to the present invention.

For the purpose of this application, the terms "wafer" and "substrate" are used interchangeably, the difference between them merely amounting to dimensions thereof.

The method according to the present invention is particularly suited for the manufacturing of micro mirror Spatial Light Modulators. However, it would be applicable to a wide variety of MEMS, thermal and non thermal detector devices, such as, but not limited to, quantum well detectors, pyroelectric detectors, bolometers, etc. It is particularly suitable when for the same reason it is not possible to process/pattern/deposit a structure (e.g. a micro mirror array) directly on a substrate, where another structure (e.g. steering electronics) is present. This can e.g. be the case if the structure provided on said substrate, is temperature sensitive to the process temperature for the processing of the structure to be provided thereon, or when the substrate is poly crystalline and the elements that is grown on top of the substrate have to be monochrystalline.

FIG. 1 illustrates schematically a first process step according to an example embodiment of the invention for forming a MEMS device with a hidden hinge. A hidden hinge is a hinge that is hidden by a reflective surface in said MEMS device when viewing said MEMS device from above, i.e., a top view. A starting material is a wafer 130, which may be made of single crystalline silicon or SOI. On top of said wafer 130 is provided a layer of mask material 120, for instance silicon oxide. Said mask material 120 may at least partly be covered with a resist film 110. In said first process step, standard photo-lithography may be used for hinge definition 140 in the mask material 120. RIE (Reactive Ion Etching), which may be $CF_4$, may be used to remove both exposed areas of the resist film 110 and underlying mask material 120.

Definition of hinges in the substrate 130 may be made by using DRIE (Deep RIE), FIG. 2. Before said hinges is defined in said substrate 130 the resist film 110 may be removed in a resist remover. Prior to the definition of the hinges in the substrate 130 said substrate may be dipped in 2% HF. The DRIE may be the well known Bosch process. The most simplified process consist of just an anisotropic DRIE etch followed, by an isotropic RIE to form the hinges. Prior to said definition of said hinges in said substrate 130, a layer of silicon oxide 150 may be provided on the opposite side of said substrate 130 with respect to where said hinges is to be defined, alternatively said layer of silicon oxide 150 may be provided on said opposite side after the definition of said hinges in said substrate 130.

In a next step, a passivation of processed surface may be performed, FIG. 3. A dry oxidization may be made in order to relax a stress in the silicon during local oxidation, not illustrated in FIG. 3. Said oxidation may be optional to increase accuracy and reduce surface roughness. A PECVD (Plasma Enhanced Chemical Vapour Deposition) of silicon nitride 160 may be made in order to act as an oxidation barrier in a following LOCOS (LOCal Oxidation of Silicon) step. A PECVD of silicon oxide 170 to act as an etch protection may be performed as a protection in a following DRIE step.

In FIG. 4 a removal of passivisation layers (silicon nitride 160 and silicon oxide 170) on horizontal surfaces has been performed and a definition of length of hinges in substrate 130 has been made. The passivisation layers may be removed by means of RIE with high directionality (low pressure and high RF power). Revealed surfaces of substrate 130 may be etched by means of DRIE (Bosch process) in order to define said length of said hinges.

In a next step, illustrated in FIG. 5, a thermal oxidation has been performed to define a width of the hinges. LOCOS may be used to transform part of the substrate 130 in the hinges to silicon oxide 180.

In FIG. 6 a removal of passivisation layers and mask material and a planarization of substrate have been performed. Passivisation layers 160, 170, 180 and mask material 120 may be etched away in BOE (Buffered Oxide Etch). Polyimide (PI) 190 may be spun on top of the substrate 130 filling the cavities therein. Reduced pressure or vacuum may be used in order to make sure that said PI will fill said cavities. Said PI may be cured at an elevated temperature. Unwanted PI may be removed with $O_2$ plasma.

A mask material 200 is deposited on top of said substrate 130, FIG. 7. Said mask material may be aluminum and the deposition may be performed by evaporation.

On top of said mask material a film of resist may be provided. Standard photolithography may define areas 220 where the definition of the mirror separation trenches will be in the substrate 130, see FIG. 8. The aluminum beneath the exposed resist may be removed with RIE (Si $CL_4/Cl_2$). The separation trenches may also be formed as a first step by using a trenched (usually filled by oxide) SOI wafer as used for trench isolation of electronics.

Unexposed resist film may be removed with acetone. On top of the mask material 200 and said relieved substrate 130 a layer of silicon oxide is provided, see FIG. 9. Said layer may be provided by means of PECVD.

On top of said silicon oxide layer 230 a layer of resist 245 is provided. Standard lithography may define mirror separation trenches 240 and electrode trenches 250 in mask material 230 (silicon oxide). The silicon oxide 230 may be etched by means of RIE, for instance $CF_4$.

In FIG. 11, mirror separation trenches 260 have been formed in the substrate 130. The resist 245 has been removed by using for instance acetone. Said mirror trenches 260 in said substrate 130 may be made by using the Bosch process.

In FIG. 12, electrode trenches 255 in the aluminum layer have been defined. Said electrode trenches may be defined by Beans of RIE, for instance $SiCl_4/Cl_2$.

PI has been introduced in said mirror trenches 260 in FIG. 13. Unwanted PI may have been removed by using $O_2$ plasma.

Electrode trenches 257 in substrate 130 have been made in FIG. 14. Said electrode trenches 257 may have been made by using the Bosch process.

In FIG. 15, silicon oxide 270 may have been PECVD to act as etch protection in the following isotropic DRIE step.

In FIG. 16, passivation layer 270 on horizontal surfaces have been removed. The removal of said passivation layers may be performed by using RIE.

A release of a foot structure has been made in FIG. 17. Isotropic RIE (may also be substituted by wet isotropic or anisotropic etching) of the substrate 130 has been made in order to release the foot of he mirror with an under etch of the material between hinges. By removing the material between the hinges, an applied actuation force to deflect the mirror to a certain deflection state may be heavily reduced. The isotropic etch also removes unnecessary material in the mirror, i.e., reduces its weight, which may affect the speed of setting the mirror from one state to another and its self oscillating frequency.

In FIG. 18, the passivation layers 230, 270 and mask layers 200 have been removed. These layers may be removed by means of BOE.

In FIG. 19, a substrate 300 with actuation electronics 310 has been attached to said substrate 130. At least one hinge is attached to said substrate 300. The substrate 300 has en elevated structure 320 for attaching said hinge(s) (alternatively the electrode areas of the substrate 130 may be lowered). Beside said elevated structure 320 actuation electronics 310 is provided. Here one can easily see that there is a big attachment area for the substrate 130 to attach to said substrate 300. Even if there may be a slightly mismatch between said two substrates, a successful attachment may nevertheless be performed. Said attachment may be a low temperature oxygen plasma assisted bonding, adhesive bonding (gluing), soldering, eutectic bonding, fusion bonding (direct bonding), glass frit bonding, anodic bonding.

In FIG. 20 the buried oxide 280 has been removed from the substrate 130. This buried oxide may be removed by means of BOE. The mirrors 132 may be released by removing the PI. PI may be removed by using $O_2$-plasma. From FIG. 20 one may see that the mirror structure is relatively stiff. This is due to the vertical part 136, which will strongly affect the stiffness and planarity of a mirror surface. The hinge 134 may be designed to be as stiff or weak as desired. The mirror may be made of a pure single crystalline material, for instance silicon. Other alternative material of the mirror may be polysilicon, quartz, three-five materials, SiC. In order to improve the electrical conductance, said mirror material may be doped if made of a semiconducting material. A surface facing towards the electronics in substrate 300 may be coated with an electrically conducting material.

FIG. 22-32 illustrates an alternative example embodiment of an inventive manufacturing process for the inventive MEMS device. In FIG. 22 a starting material is a wafer 130, which may be made of single crystalline silicon or SOI. On top of said wafer 130 is provided a layer of mask material 120, for instance silicon oxide. Said mask material 120 may at least partly be covered with a resist film 110. In said first process step, standard photo-lithography may be, used for defining trench separation 300 in the mask material 120. RIE (Reactive Ion Etching), which may be $CF_4$ may be used to remove both exposed areas of the resist film 110 and underlying mask material 120. Definition of trench separation in the substrate 130 may be made by using DRIE (Deep RIE), FIG. 22. Before said trench separations 300 are defined in said substrate 130 the resist film 110 may be removed in a resist remover. Prior to the definition of the hinges in the substrate 130 said substrate may be dipped in 2% HF. The DRIE may be the well known Bosch process. The most simplified process consist of just an anisotropic DRIE etch followed by an isotropic RIE to form said trenches. Prior to said definition of said trenches in said substrate 130, a layer of silicon oxide 150 may be provided on the opposite side of said substrate 130 with respect to where said trenches 300 are to be defined, alternatively said layer of silicon oxide 150 may be provided on said opposite side after the definition of said trenches in said substrate 130.

Said trenches 300 may be filled by first spinning Polyimide (PI) 310 on top of the substrate 130 filling the cavities therein. Reduced pressure or vacuum may be used in order to make sure that said PI will fill said cavities. Said PI may be cured at an elevated temperature. Unwanted PI may be removed with $O_2$ plasma, see FIG. 24.

FIG. 25-29 illustrates the process steps for defining the buried or hidden hinges. In FIG. 25, standard photo-lithography may be used for defining entrance holes 310 in the mask material 120. RIE (Reactive Ion Etching), which may be $CF_4$, may be used to remove both exposed areas of the resist film 110 and underlying mask material 120.

Figure 26:
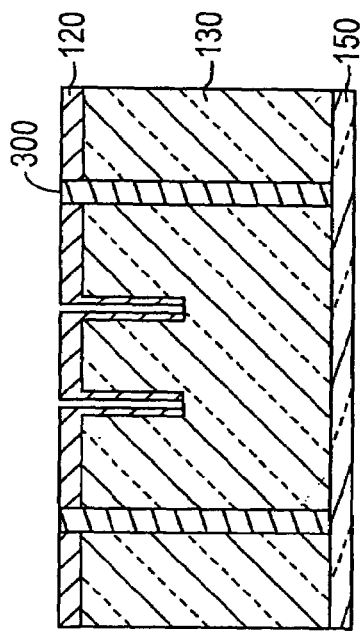

In FIG. 26 a dry etch may be used for defining holes 320 in the substrate 130. After said holes 320 have been defined in said substrate 130 a stripping of said resist 110 may be performed. After stripping the resist a layer of oxide may be deposited in order to arrange a layer of oxide in said holes 320.

Figure 27:
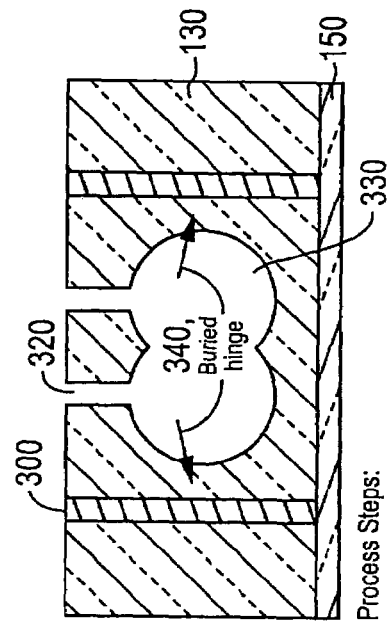

In FIG. 27 a dry etch may be used to etch horizontal surfaces of said layer of oxide.

Figure 28:
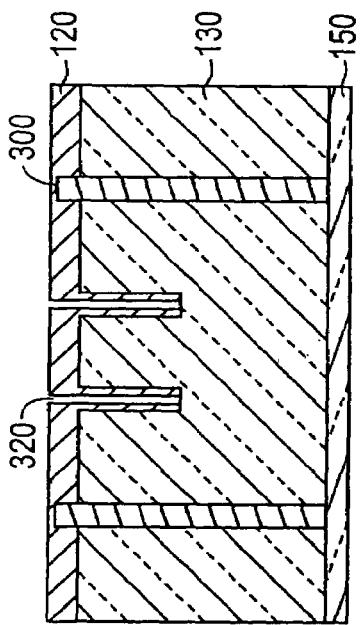
Figure 29:
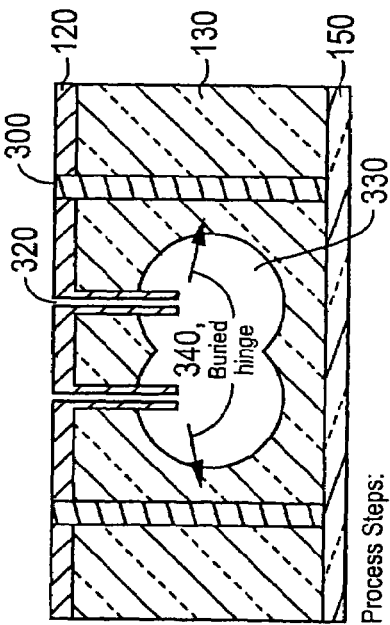
Figure 31:
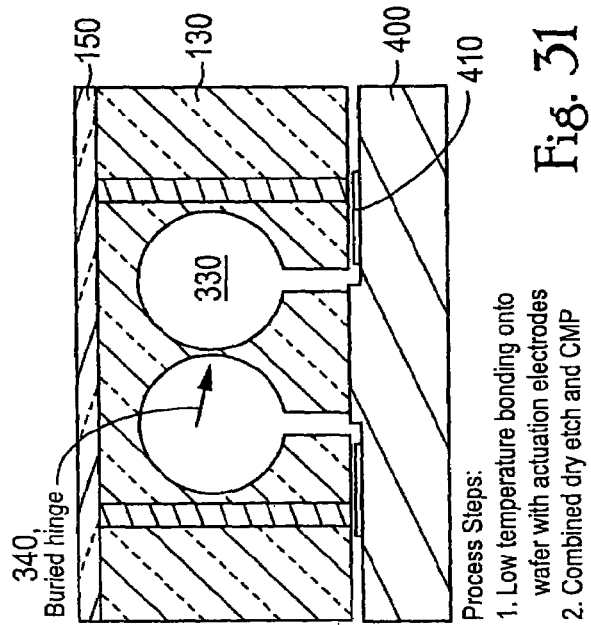
Figure 30:
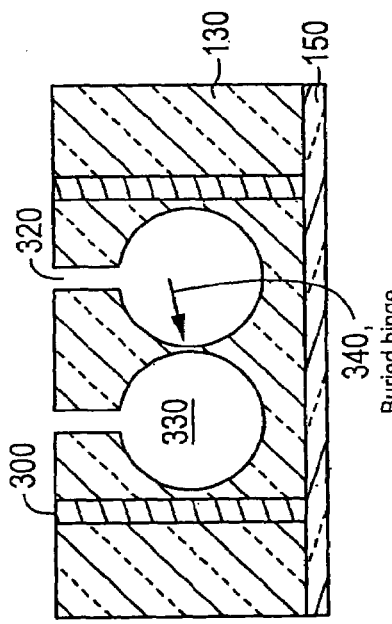
Figure 32:
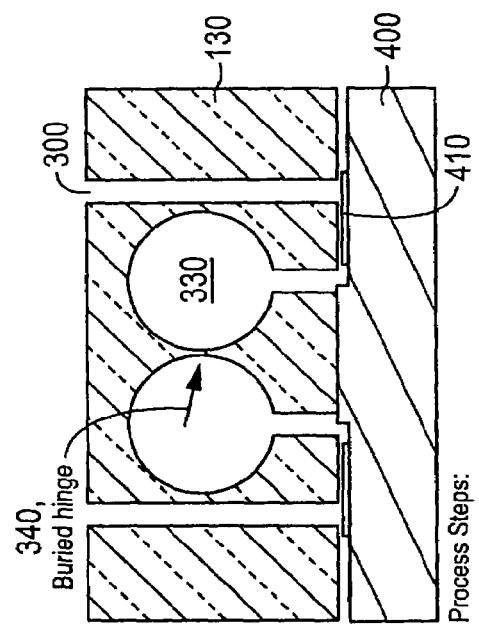

In FIG. 28 an isotropic dry etch may be used to create a cavity 330 and buried hinges 340 in the substrate 130. In FIG. 29 the oxide layer has been removed in BOE. In FIG. 30 an alternative cross section of the structure is illustrated, the cross section is illustrates to the left to FIG. 30. In FIG. 31 the substrate 130 may be bonded onto a wafer 400 with actuation electrodes 410. The oxide layer 150 may be removed by means of BOE, and the polyimide by dry etching in $O_2$ plasma, see FIG. 32

FIG. 21 illustrates a perspective view of an example embodiment of a mirror structure 132 according to the present invention. Said mirror structure comprising a mirror surface 135, supports 134, cavity 131, base element 136, a first leg 142 and a second leg 144. The mirror structure 132 may have at least one cross section which is as thick as the original substrate 130, which in this particular embodiment may be the distance from the mirror surface 135 to an electrostatically attraction surface 145, 147. This may give the mirror structure good mechanical properties, such as high stiffness, i.e., the mirror surface is essentially rigid while being in a deflected position. The supports 134 may be thin pillars. The supports may support the mirror structure 132 and at the same time function as a hinge. In the illustrated example embodiment in FIG. 21 said support is arranged so that the rotational axis is essentially in the middle of the structure. In an alternative example embodiment said rotational axis may be arranged off center, which may be achieved by displacing the supports from a center position. An axis of rotation of the mirror surface 135 may be parallel to the mirror surface and perpendicular to the support 134.

The base element 136 and the support 134 may be denoted a hidden hinge. In another embodiment the base element 136 is minimized so that the support 134 only may be denoted the hidden hinge (hidden support). The cross section of said pillars may be polygonal, for instance triangular or rectangular. The base element 136 may be attached to the supports 134. A bottom surface of the base element 143 may be attachable to another surface, such as a wafer with steering-electronics. The legs 142, 144 may have surfaces 146, 148 essentially perpendicular to the mirror surface 135. The cavity 131 may be formed by means of an isotropic etching process according to the example embodiment above. The mirror structure 132 may be doped. The doping is preferably made prior to defining the cavity 131 and supports 134, i.e., the substrate to be used for defining said mirror structure may be doped. In this embodiment the electrostatically attraction surface 147 may be used to rotate the mirror structure 132 clockwise. The electrostatically attraction surface 145 may be used to rotate the mirror structure 132 counter clockwise, i.e., said structure may be rotated clockwise or anti clockwise from non actuated state. The surface 143 of the base element 136 may be at another level compared to the electrostatically attraction surfaces 145, 147.

In the embodiments disclosed hereinabove the actuation of the mirror element has been electrostatic. However, other means of actuating the mirror element is possible such as thermal, piezoelectric or magnetic, which is well known for a skilled person is the art.

Thus, although there has been disclosed to this point particular embodiments of the method of combining components to form an integrated device, it is not intended that such specific references be considered as limitations upon the scope of this invention except in-so-far as set forth in the following claims. Furthermore, having described the invention in connection with certain specific embodiments thereof, it is to be understood that further modifications may suggest themselves to those skilled in the art, it is intended to cover all such modifications as fall within the scope of the appended claims.

The invention claimed is:

1. A MEMS device comprising:
   a first substrate having at least one reflective surface, at least one hidden support, and at least one leg, the at least one reflective surface, the at least one hidden support and the at least one leg being an integral portion of the first substrate; wherein
   said hidden support is hidden underneath said reflective surface, and
   said at least one leg has a first surface essentially perpendicular to said reflective surface and a second electrostatically attractable surface essentially in parallel with said reflective surface, said electrostatically attractable surface being operable to rotate the reflective surface around a rotational axis.

2. The MEMS device according to claim 1, wherein said hidden hinge is essentially perpendicular to said reflective surface.

3. The MEMS device according to claim 1, wherein said MEMS device is an SLM.

4. The MEMS device according to claim 3, wherein said SLM comprises:
at least one mirror element; wherein the at least one reflective surface serves as the at least one mirror element.

5. The MEMS device according to claim 4, wherein said at least one mirror element is deflectable by bending said hidden support while said at least one mirror element is kept essentially rigid when deflected.

6. The MEMS device according to claim 3, wherein said SLM comprises:
at least one mirror element with a surface having diffractive properties.

7. The MEMS device according to claim 6, wherein said at least one mirror element is deflectable by bending said hidden support while said at least one mirror element is kept essentially rigid when deflected.

8. The MEMS device according to claim 1, wherein said first substrate is doped.

9. The MEMS device according to claim 1, wherein said reflective surface is rotatable in a first and a second direction from a non actuated state.

10. The MEMS device according to claim 1, wherein an actuation electrode is configured to actuate said reflective surface electrostatically, magnetically, piezoelectrically or thermally.

11. The MEMS device according to claim 1, further comprising:
at least one actuation electrode provided on a second substrate, said second substrate being operable for actuating said reflective surface; wherein
said second substrate is connected to said first substrate and said rotational axis of said reflective surface is essentially perpendicular to said hidden support.

12. The MEMS device according to claim 11, wherein said second substrate is a wafer.

* * * * *